United States Patent
Wang

(10) Patent No.: US 10,490,123 B2
(45) Date of Patent: Nov. 26, 2019

(54) OLED DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Zhenling Wang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 50 days.

(21) Appl. No.: 15/579,514

(22) PCT Filed: Nov. 20, 2017

(86) PCT No.: PCT/CN2017/111973
§ 371 (c)(1),
(2) Date: Dec. 4, 2017

(87) PCT Pub. No.: WO2019/071727
PCT Pub. Date: Apr. 18, 2019

(65) Prior Publication Data
US 2019/0228701 A1    Jul. 25, 2019

(30) Foreign Application Priority Data

Oct. 10, 2017  (CN) .......................... 201710936498.6

(51) Int. Cl.
*G09G 3/3225* (2016.01)
*H01L 27/32* (2006.01)
*G09G 3/00* (2006.01)

(52) U.S. Cl.
CPC .......... *G09G 3/3225* (2013.01); *G09G 3/006* (2013.01); *H01L 27/3276* (2013.01); *G09G 2320/043* (2013.01); *G09G 2330/12* (2013.01)

(58) Field of Classification Search
CPC ............. G09G 3/3225; G09G 2330/12; G09G 2320/043
See application file for complete search history.

(56) References Cited

U.S. PATENT DOCUMENTS

| | | | |
|---|---|---|---|
| 2006/0044237 A1 | 3/2006 | Lee et al. | |
| 2009/0045727 A1* | 2/2009 | Kwak | ................. H01L 27/3276 313/504 |
| 2016/0233287 A1* | 8/2016 | Jang | .................... H01L 27/3279 |

FOREIGN PATENT DOCUMENTS

| CN | 103927968 | 7/2014 |
|---|---|---|
| CN | 104464627 | 3/2015 |

(Continued)

*Primary Examiner* — Md Saiful A Siddiqui
(74) *Attorney, Agent, or Firm* — Hemisphere Law, PLLC; Zhigang Ma

(57) ABSTRACT

The present disclosure provides an OLED display device. The detection chip of the OLED display device includes a first and a second internal wirings spaced apart from each other, a plurality of first connection points and a third connection point between two ends of the first internal wiring are provided on the first internal wiring, a plurality of second connection points and a fourth connection point between two ends of the second internal wiring are provided on the second internal wiring. A reference voltage inputs toward the first and the second internal wirings via the third and the fourth connection points, further via the first and the second connection points to the plurality of sensing lines, finally inputs to the OLED panel. This can effectively reduce voltage variation of the reference voltage inputted to the sensing line through the detection chip, and make the detection chip has a smaller size.

14 Claims, 4 Drawing Sheets

(56) References Cited

FOREIGN PATENT DOCUMENTS

| | | |
|---|---|---|
| CN | 104867455 | 8/2015 |
| CN | 105788530 | 7/2016 |
| CN | 106128359 | 11/2016 |
| CN | 106297665 | 1/2017 |
| CN | 107016965 | 8/2017 |

* cited by examiner

--Prior Art--

OLED DISPLAY DEVICE

RELATED APPLICATIONS

The present application is a National Phase of International Application Number PCT/CN2017/111973, filed on Nov. 20, 2017, and claims the priority of China Application No. 201710936498.6, filed on Oct. 10, 2017.

FIELD OF THE DISCLOSURE

The present disclosure relates to a display panel technology, and more particularly to an OLED display device.

BACKGROUND

Organic light emitting display (OLED) device with advantages such as self-luminous, low driving voltage, high luminous efficiency, short response time, high definition and contrast, nearly 180° viewing angle, wide temperature range, flexible and large-area panchromatic display, and so on, is recognized as the most promising display device in the industry.

OLED display device generally includes: a substrate, an anode disposed on the substrate, a hole injection layer disposed on the anode, a hole transport layer disposed on the hole injection layer, a light-emitting layer disposed on the hole transport layer, an electron transport layer disposed on the light-emitting layer, an electron injection layer provided on the electron transport layer, and a cathode provided on the electron injection layer. The light-emitting principle of OLED display devices is that semiconductor materials and organic light-emitting materials being driven by an electric field to emit light by carrier recombination. Specifically, the OLED display device usually adopts indium tin oxide (ITO) pixel electrodes and metal electrodes as the anode and the cathode of the device, respectively. Under a certain driving voltage, electrons and holes are injected from the cathode and the anode into the electron transport layer and the holes transport layer, the electron and the hole respectively migrate to the light-emitting layer through the electron transport layer and the hole transport layer, and meet in the light-emitting layer to form an exciton and excite the light-emitting molecule, which emits visible light through radiation relaxation.

The OLED display device can be classified into passive matrix OLED (PMOLED) type and active matrix OLED (AMOLED) type according to driving modes, that is, direct addressing and thin film transistor (TFT) matrix addressing two categories. Among them, AMOLED has matrix arranged pixels, belonging to the active display type, which has high luminous efficiency and usually being used for high-definition large-size display device.

AMOLED is a current-driven device. When a current flows through the organic light-emitting diode, the organic light-emitting diode emits light, and the light-emitting brightness is determined by the current flowing through the organic light-emitting diode itself. Most of the existing integrated circuits (ICs) only transmit voltage signals, so the pixel driving circuit of AMOLED needs to complete the task of converting voltage signals into current signals. Generally, the AMOLED pixel driving circuit is provided with a driving thin film transistor for driving the organic light emitting diode to emit light. In use, due to the aging of the organic light emitting diode and the threshold voltage variation of the driving thin film transistor, display quality of the OLED display device will decrease. Accordingly, in the prior art, the sub-pixels of the OLED display device are electrically connected to a detection chip (IC) through a plurality of sensing lines. The detection chip inputs a reference voltage to the plurality of sub-pixels via the plurality of sensing lines, meanwhile detecting the sub-pixels to acquire the degree of aging of the organic light emitting diodes and the threshold voltage variation degree of the driving thin film transistors, and thereby to compensate the aging of the organic light emitting diodes and the threshold voltage variation, so as to ensure the display quality of the OLED display device.

Please refer to FIG. 1, which is a schematic structural diagram of an existing OLED display device. The OLED display device includes an OLED panel 100', a detection chip 200' and a plurality of sensing lines 300' electrically connecting the detection chip 200' to the OLED panel 100'. The detection chip 200' has a linear internal wiring 210' and a plurality of switches S' respectively corresponding to the sensing lines 300'. Each of the sensing lines 300' is electrically connected to the internal wiring 210' through the corresponding switches S'. Two ends of the internal wiring 210' are electrically connected to one end of an external input wiring 400', respectively, the other ends of the two external input wirings 400' are accessing to a reference voltage, Vref. A plurality of switches S' are turned off during operation, the reference voltage inputs into the plurality of sensing lines 300' through the external input wiring 400' and the internal wiring 210', respectively, and then inputs into the OLED panel 100'. Since both the internal wiring 210' and the external input wiring 400' have equivalent resistances, and current flows through the sensing lines 300', the internal traces 210', and the external input wiring 400' when the OLED display device is operating, IR drop effect with different degrees is generated at different positions of the internal wiring 210'. Moreover, the positions of the plurality of sensing lines 300' electrically connected to the internal wiring 210' are different, that may cause voltage variation between the reference voltage and the voltage inputted to different sensing lines 300' via the detection chip 200', wherein the middle part of the sensing line 300' has the most serious reference voltage variation. In order to improve the display quality of the picture and eliminate the voltage variation when the reference voltage inputted to the different sensing lines 300' due to the IR voltage drop effect of the internal wiring 210', the prior art generally increases the area of the internal wiring 210' to reduce the equivalent resistance of the internal wiring 210', however, the size of the detection chip 200' is greatly increased.

SUMMARY

The present disclosure aims to provide an OLED display device, which is able to reduce voltage variation of a reference voltage inputted to a sensing line via a detecting chip, and make the detecting chip have a smaller size.

In order to achieve the above objectives, the present disclosure provides an OLED display device, comprising: a detection chip, two external input wirings electrically connected to the detection chip, a plurality of sensing lines electrically connected to the detection chip, and an OLED panel electrically connected to the plurality of sensing lines.

The detection chip comprises a first internal wiring and a second internal wiring spaced apart from each other, and a plurality of switches in one-to-one correspondence with the plurality of sensing lines.

A plurality of first connection points spaced apart from each other and a third connection point between two ends of the first internal wiring are provided on the first internal wiring; a plurality of second connection points apart from each other and a fourth connection point between two ends of the second internal wiring are provided on the second internal wiring.

The plurality of sensing lines are in one-to-one correspondence with the plurality of first connecting points and the plurality of second connecting points respectively, one ends of the plurality of sensing lines are electrically connecting to one ends of the corresponding switches, the other ends of the plurality of sensing lines are electrically connecting to the OLED panel. And, the other ends of the corresponding switches respectively are electrically connecting to the first connection point or the second connection point corresponding to the sensing lines connected thereto, one ends of the two external input wirings is electrically connecting to the third connection point and the fourth connection point respectively, the other ends of the two external input wirings are accessing to a reference voltage.

The plurality of switches are turned off when the OLED panel is displayed, one end of the sensing line connected thereto is electrically connecting to the corresponding first connection point or the second connection point.

The equivalent resistances of the first internal wiring at portions located on both sides of the third connection point are equal.

The equivalent resistances of the second internal wiring at portions located on both sides of the fourth connection point are equal.

The equivalent resistances of the first internal wiring and the second internal wiring are equal.

The quantities of the first connection points and the second connection points are the same.

Two ends of the first internal wiring are two first connection points; two ends of the second internal wiring are two second connection points.

The equivalent resistances of portions between any two adjacent first connection points on the first internal wiring are equal.

The equivalent resistances of the portion between any two adjacent second connection points on the second internal wiring are equal.

The first internal wiring and the second internal wiring are located in the same straight line.

The present disclosure further provides an OLED display device, comprising: a detection chip, two external input wirings electrically connected to the detection chip, a plurality of sensing lines electrically connected to the detection chip, and an OLED panel electrically connected to the plurality of sensing lines.

The detection chip comprising a first internal wiring and a second internal wiring spaced apart from each other, and a plurality of switches in one-to-one correspondence with the plurality of sensing lines.

A plurality of first connection points spaced apart from each other and a third connection point between two ends of the first internal wiring provided on the first internal wiring, a plurality of second connection points apart from each other and a fourth connection point between two ends of the second internal wiring provided on the second internal wiring.

The plurality of sensing lines in one-to-one correspondence with the plurality of first connecting points and the plurality of second connecting points respectively, one ends of the plurality of sensing lines electrically connecting to one ends of the corresponding switches, the other ends of the plurality of sensing lines electrically connecting to the OLED panel. The other ends of the corresponding switches respectively electrically connecting to the first connection point or the second connection point corresponding to the sensing lines connected thereto, one ends of the two external input wirings electrically connecting to the third connection point and the fourth connection point respectively, the other ends of the two external input wirings accessing to a reference voltage.

Herein, the plurality of switches are turned off when the OLED panel is displayed, one end of the sensing line connected thereto is electrically connecting to the corresponding first connection point or the second connection point.

Herein, the equivalent resistances of the first internal wiring at portions located on both sides of the third connection point are equal.

Herein, the equivalent resistances of the second internal wiring at portions located on both sides of the fourth connection point are equal.

Herein, the equivalent resistances of the first internal wiring and the second internal wiring are equal.

The advantageous effects of the present disclosure are: the present disclosure provides an OLED display device, the detection chip thereof comprising a first internal wiring and a second internal wiring spaced apart from each other, a plurality of first connection points and a third connection point between two ends of the first internal wiring are provided on the first internal wiring, a plurality of second connection points and a fourth connection point between two ends of the second internal wiring are provided on the second internal wiring. A reference voltage inputs toward the first internal wiring and the second internal wiring via the third connection point and the fourth connection point, further via the first connection point and the second connection point to the plurality of sensing lines, and finally inputs to the OLED panel. This can effectively reduce voltage variation of the reference voltage inputted to the sensing line through the detection chip, and make the detection chip has a smaller size.

BRIEF DESCRIPTION OF THE DRAWINGS

The features and technical contents of the present disclosure will now be described in detail with reference illustrated by accompanying drawings, which are illustration only, and not limitative of the present invention.

In the drawings.

DETAILED DESCRIPTION OF PREFERRED EMBODIMENTS

To further illustrate the technical means and effects, the present disclosure is further described in detail below with accompanying figures and embodiments.

Figure 2:
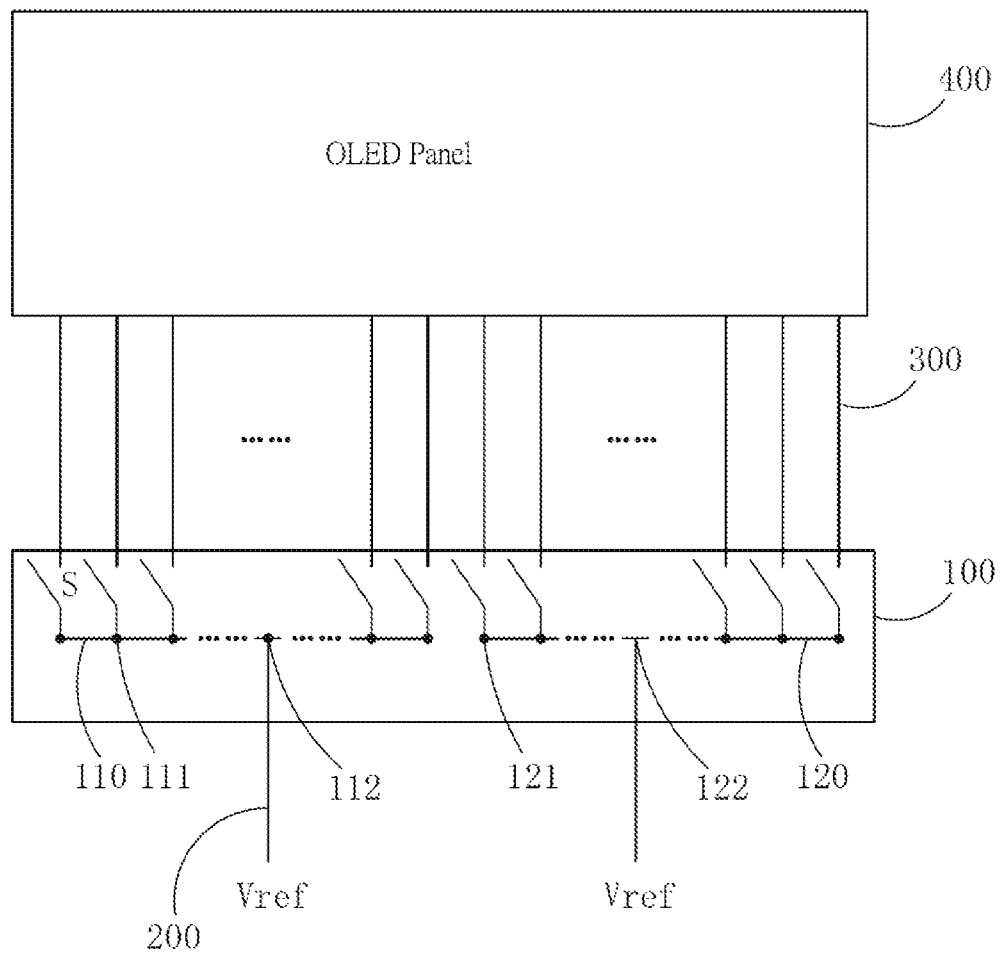
FIG. 2 is a schematic structural diagram of an OLED display device according to the present disclosure.

Referring to FIG. 2, the present disclosure provides an OLED display device, comprising: a detection chip 100, two external input wirings 200 electrically connected to the detection chip 100, a plurality of sensing lines 300 electrically connected to the detection chip 100, and an OLED panel 400 electrically connected to the plurality of sensing lines 300.

The detection chip 100 comprises a first internal wiring 110 and a second internal wiring 120 spaced apart from each other, and a plurality of switches S in one-to-one correspondence with the plurality of sensing lines 300.

A plurality of first connection points 111 spaced apart from each other and a third connection point 112 between two ends of the first internal wiring 110 are provided on the first internal wiring 110. A plurality of second connection points 121 apart from each other and a fourth connection point 122 between two ends of the second internal wiring 120 are provided on the second internal wiring 120.

The plurality of sensing lines 300 in one-to-one correspondence with the plurality of first connecting points 111 and the plurality of second connecting points 121 respectively, one ends of the plurality of sensing lines 300 are electrically connecting to one ends of the corresponding switches S, the other ends of the plurality of sensing lines 300 are electrically connecting to the OLED panel 400. The other ends of the corresponding switches S are respectively electrically connecting to the first connection point 111 or the second connection point 121 corresponding to the sensing lines 300 connected thereto, one ends of the two external input wirings 200 are electrically connecting to the third connection point 112 and the fourth connection point 122 respectively, the other ends of the two external input wirings are accessing to a reference voltage (Vref).

In particular, the plurality of switches S are turned off when the OLED panel 400 is displayed, one end of the sensing line 300 connected thereto is electrically connecting to the corresponding first connection point 111 or the second connection point 121. Thus, the reference voltage respectively inputs to the first internal wiring 110 and the second internal wiring 120 via two external input wiring 200, and then inputs to the plurality of sensing lines 300 via the plurality of first connection point 111 and the second connection point 121, and finally inputs to the OLED panel 400. Resulting in the detection chip 100 is able to detect the OLED panel 400 through the plurality of sensing lines 300, and acquire the degree of aging of the organic light emitting diode and the degree of threshold voltage deviation of the driving thin film transistor in each pixel of the OLED panel 400. After that, correspondingly compensating the aging of the organic light emitting diode and the threshold voltage variation of the driving thin film transistor.

In particular, please refer to FIG. 2, in one preferred embodiment of the present disclosure, the equivalent resistances of the first internal wiring 110 at portions located on both sides of the third connection point 112 are equal; the equivalent resistances of the second internal wiring 120 at portions located on both sides of the fourth connection point 122 are equal; the equivalent resistances of the first internal wiring 110 and the second internal wiring 120 are equal; the quantities of the first connection points 111 and the second connection points 121 are the same; two ends of the first internal wiring 110 are two first connection points 111; two ends of the second internal wiring 120 are two second connection points 121; the equivalent resistances of portions between any two adjacent first connection points 111 on the first internal wiring 110 are equal; the equivalent resistances of the portion between any two adjacent second connection points 121 on the second internal wiring 120 are equal. That is, in the preferred embodiment of the present disclosure, the first internal wiring 110 and the second internal wiring 120 are respectively divided into few parts with equal quantities by the first connection point 111 and the second connection point 121. The equivalent resistances of each part are the same, the first internal wiring 110 and the second internal wiring 120 are respectively connecting to the equal number of sensing lines 300 via the equal number of the first connection point 111 and the second connection point 121.

Figure 1:
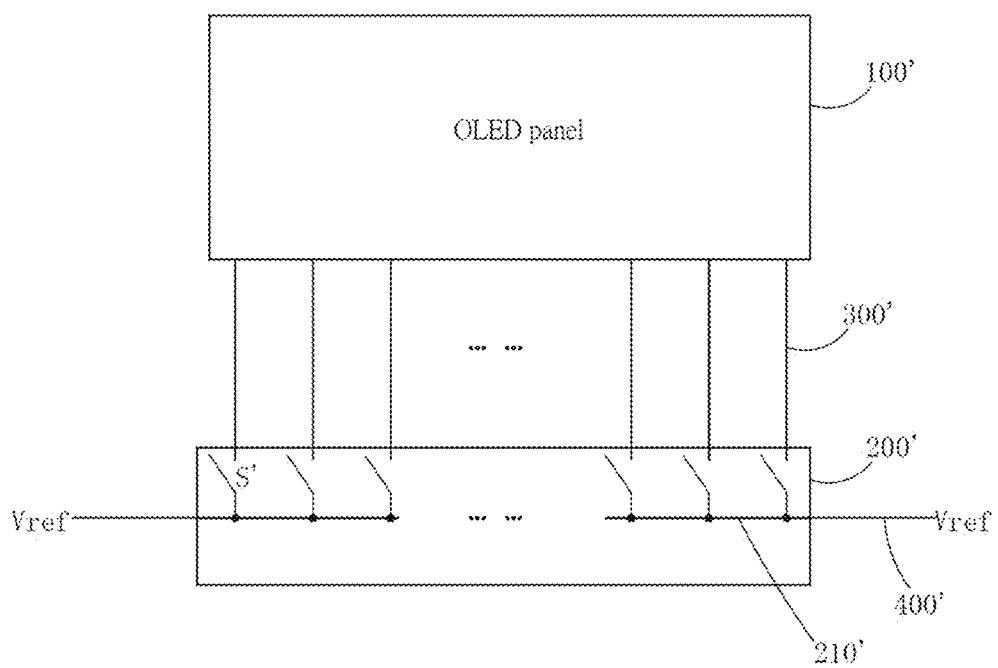
FIG. 1 is a schematic structural diagram of an existing OLED display device.

In particular, in the preferred embodiment of the present disclosure, the first internal wiring 110 and the second internal wiring 120 are located in the same straight line, which is equivalent to divide the internal wiring 210' in the detection chip 200' of the existing OLED display device into two parts as shown in FIG. 1.

It should be understood that, apart from accessing two ends of one internal wiring 210' into an external wiring 400' as shown in the detection chip 200' of the existing OLED display device illustrated in FIG. 1, the first internal wiring 100 and the second internal wiring 120 of the present disclosure are interval arranged, a third connection point 112 is provided on the first internal wiring 110 for dividing the first internal wiring 110 into two portions with same equivalent resistance, and a fourth connection point 122 is provided on the second internal wiring 120 for dividing the second internal wiring 120 into two portions with same equivalent resistance. By connecting the third connection point 112 and the fourth connection point 122 to the external input wiring 200 to access the reference voltage (Vref) can effectively reduce voltage variation of the reference voltage when input through the sensing lines 300 of the detection chip 100.

Figure 3:
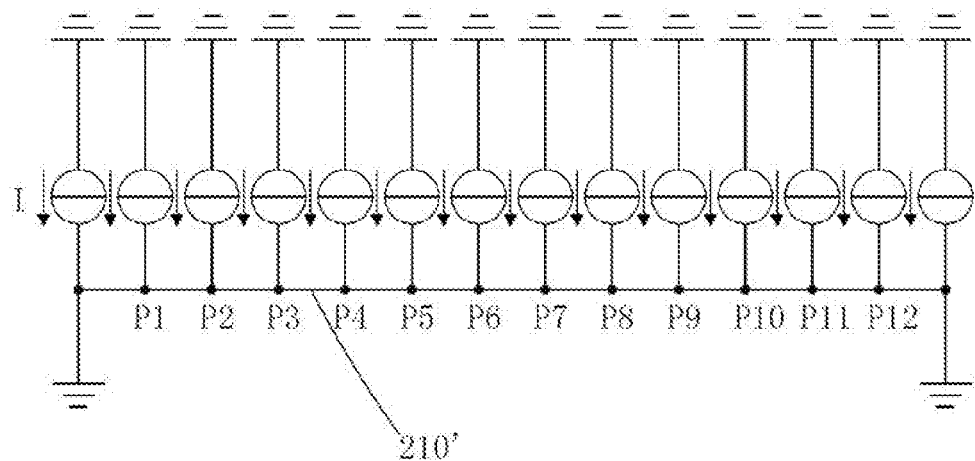
FIG. 3 is a schematic diagram showing IR pressure drop simulation on a plurality of locations on an internal wiring of an existing OLED display device.

Herein, simulating to IR pressure drop at multiple locations on the first internal wiring 110 and the second internal wiring 120 in the detection chip 100 of the present OLED display device, as well as to simulate the IR pressure drop at multiple locations of the internal wiring 210' in the detection chip 200' of the existing OLED display device shown in FIG. 1, the specific process is: first referring to FIG. 3, where the internal wiring 210' in the detection chip 200' of the OLED display device shown in FIG. 1 is divided into 13 parts with equal equivalent resistance values, the junctions of the 13 parts along a direction from one end to the other ends of the internal wiring 210' are defined as a first measurement point P1, a second measurement point P2, a third measurement point P3, a fourth measurement point P4, a fifth measurement point P5, a sixth measurement point P6, a seventh measurement point P7, an eighth measurement point P8, a ninth measurement point P9, a tenth measurement point P10, an eleventh measurement point P11, and a twelfth measurement point P12.

After that, respectively providing 14 current sources I to the first measurement point P1, the second measurement point P2, the third measurement point P3, the fourth measurement point P4, the fifth measurement point P5, the sixth measurement point P6, the seventh measurement point P7, the eighth measurement point P8, the nine measurement points P9, the tenth measurement point P10, the eleventh measurement point P11, the twelfth measurement point P12, and the internal wiring 210'. Two ends of the internal wiring 210' are grounded, that is, the reference voltages (Vref) accessing to both ends of the internal wiring 210' are ground voltage.

After that, respectively measuring voltage values of the first measurement point P1, the second measurement P2, the third measurement point P3, the fourth measurement point P4, the fifth measurement point P5, the sixth measurement point P6, the seventh measurement point P7, the eighth measurement point P8, the ninth measurement point P9, and the tenth measurement point P10, and obtaining the corresponding measured voltage values of 1.05 mV, 1.92 mV, 2.62 mV, 3.15 mV, 3.5 mV, 3.67 mV, 3.67 mV, 3.5 mV, 3.15 mV, 2.62 mV, 1.92 mV and 1.05 mV, respectively. It can be seen that due to the IR voltage drop effect, each measurement point of the internal wiring 210' has a voltage difference with the ground voltage, also named the reference voltage. Among the 13 parts of the internal wiring 210', the voltage difference at two ends in the middle portion, that is between the sixth measurement point P6 and the seventh measurement point P7 is the largest, which is 3.67 mV.

Figure 4:
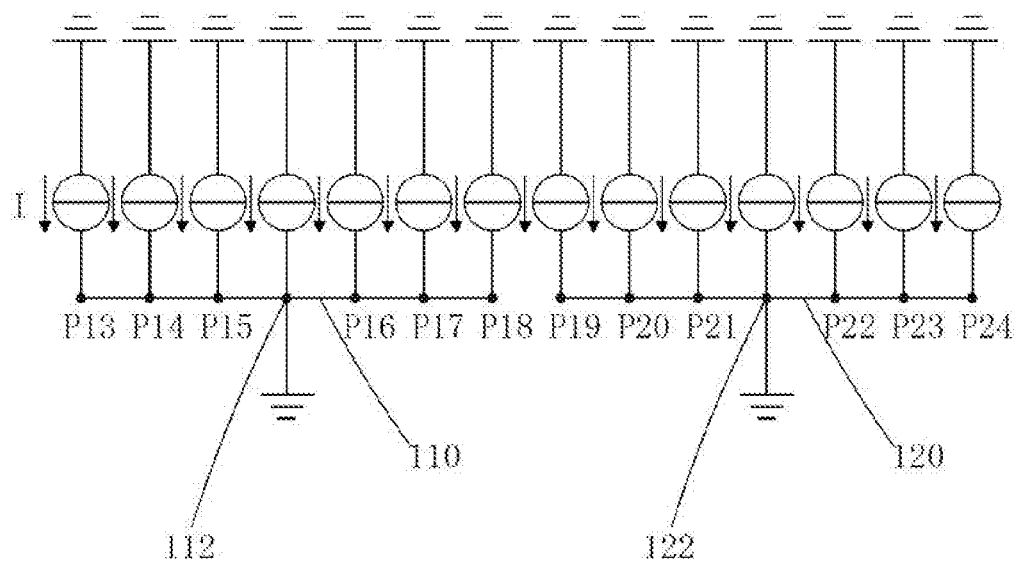
FIG. 4 is a schematic diagram showing IR pressure drop simulation on a plurality of locations on first internal wiring and second internal wiring of an OLED display device according to one preferred embodiment of the present disclosure.

Furthermore, please refer to FIG. 4, take the first internal wiring 110 and the second internal wiring 120 with equal equivalent resistance value for example, the first internal wiring 110 and the second internal wiring 120 can both be divided into 6 parts with equal equivalent resistance values, the equivalent resistance value of each part is no different to one of the 13 parts of the internal wiring 210' shown in FIG. 3.

The two ends of the first internal wiring 110 and the junctions of the 6 parts except the middle junction along a direction from one end to the other end of the first internal wiring 110 are defined sequentially as a thirteenth measurement point P13, a fourteenth measurement point P14, a fifteenth measurement point P15, a sixteenth measurement point P16, a seventeenth measurement point P17, and an eighteenth measurement point P18. The middlemost junction of the first internal wiring 110 is the third connection point 112 for connection with the external input wiring 400 in the present disclosure. The two ends of the second internal wiring 120 and the junctions of the 6 parts except the middle junction along a direction from one end to the other end of the second internal wiring 120 are defined sequentially as a nineteenth measurement point P19, a twentieth measurement point P20, a twenty-first measurement point P21, a twenty-second measurement point P22, a twenty-third measurement point P23, and a twenty-fourth measurement point P24. The middlemost junction on the second internal wiring 120 is the fourth connection point 122 for connection with the external input line 400 in the present disclosure.

After that, the internal wiring 210' as shown in FIG. 3 respectively provides 14 current sources I to the thirteenth measurement point P13, the fourteenth measurement point P14, the fifteenth measurement point P15, the sixteenth measurement point P16, the seventeenth measurement point P17, the eighteenth measurement point P18, the nineteenth measurement point P19, the twentieth measurement point P20, the twenty-first measurement point P21, the twenty-second measurement point P22, the twenty-third measurement point P23, and the twenty-fourth measurement point P24. Meanwhile, grounding the third connection point 112 and the fourth connection point 122, that is the inputted reference voltage is the ground voltage.

After that, respectively measuring voltage values of the thirteenth measurement point P13, the fourteenth measurement point P14, the fifteenth measurement point P15, the sixteenth measurement point P16, the seventeenth measurement point P17, the eighteenth measurement point P18, the nineteenth measurement point P19, the twentieth measurement point P20, the twenty-first measurement point P21, the twenty-second measurement point P22, the twenty-third measurement point P23, and the twenty-fourth measurement point P24, and obtaining the corresponding measured voltage values of 1.05 mV, 875 µV, 525 µV, 525 µV, 875 µV, 1.05 mV, 1.05 mV, 875 µV, 525 µV, 525 µV, 875 µV and 1.05 mV, respectively. It can be seen that due to the IR voltage drop effect, each measurement point of the internal wiring 210' has a voltage difference with the ground voltage, also named the reference voltage. Among the 13 parts of the internal wiring 210', the voltage difference at two ends in the middle portion, that is between the sixth measurement point P6 and the seventh measurement point P7 is the largest, which is 3.67 mV.

Compared with the existing art, the voltage difference between the measuring point and the ground voltage, that is, the reference voltage is smaller. Specially, the maximum value of the voltage difference of the reference voltage is only 1.05 mV, which is 3.5 times that of the existing art. Resulting in after arranging the first connection point 111 and the second connection point 121 on the first internal wiring 110 and the second internal wiring 120, respectively, the voltage variation of the reference voltage inputted to the sensing wiring 300 through the detection chip 100 is greatly reduced. When the reference voltage is within the standard range, the design width of the first internal wiring 110 and the second internal wiring 120 can be reduced, so as to reduce the size of the detection chip 100.

As described above, the detection chip of the OLED display device in the present disclosure provides a first and a second internal wirings spaced apart from each other, a plurality of first connection points and a third connection point between two ends of the first internal wiring are provided on the first internal wiring, a plurality of second connection points and a fourth connection point between two ends of the second internal wiring are provided on the second internal wiring. A reference voltage inputs toward the first and the second internal wirings via the third and the fourth connection points, further via the first and the second connection points to the plurality of sensing lines, and finally inputs to the OLED panel. This can effectively reduce voltage variation of the reference voltage inputted to the sensing line through the detection chip, and make the detection chip has a smaller size.

While the disclosure has been particularly shown and described with reference to exemplary embodiments thereof, it will be understood by those skilled in the art that various changes in form and details may be made therein without departing from the spirit and scope of the disclosure as defined by the appended claims and their equivalents.

What is claimed is:

1. An OLED display device, comprising: a detection chip, two external input wirings electrically connected to the detection chip, a plurality of sensing lines electrically connected to the detection chip, and an OLED panel electrically connected to the plurality of sensing lines;
   the detection chip comprising a first internal wiring and a second internal wiring spaced apart from each other, and a plurality of switches in one-to-one correspondence with the plurality of sensing lines;
   a plurality of first connection points spaced apart from each other and a third connection point between two ends of the first internal wiring provided on the first internal wiring, a plurality of second connection points apart from each other and a fourth connection point between two ends of the second internal wiring provided on the second internal wiring;
   the plurality of sensing lines in one-to-one correspondence with the plurality of first connecting points and the plurality of second connecting points respectively, one ends of the plurality of sensing lines electrically connecting to one ends of the corresponding switches, the other ends of the plurality of sensing lines electrically connecting to the OLED panel; and the other ends of the corresponding switches respectively electrically connecting to the first connection point or the second connection point corresponding to the sensing lines connected thereto, one ends of the two external input wirings electrically connecting to the third connection point and the fourth connection point respectively, the other ends of the two external input wirings accessing to a reference voltage, wherein equivalent resistances of portions that any two adjacent switches respectively connected to the corresponding first connection points are equal, and equivalent resistances of the portions that any two adjacent switches respectively connected to the corresponding second connection points are equal.

2. The OLED display device according to claim 1, wherein the plurality of switches electrically connects one end of the sensing line to the corresponding first connection point or the second connection point when the OLED panel is displayed.

3. The OLED display device according to claim 1, wherein equivalent resistances of the first internal wiring at portions located on both sides of the third connection point are equal.

4. The OLED display device according to claim 1, wherein equivalent resistances of the second internal wiring at portions located on both sides of the fourth connection point are equal.

5. The OLED display device according to claim 1, wherein equivalent resistances of the first internal wiring and the second internal wiring are equal.

6. The OLED display device according to claim 5, wherein quantities of the first connection points and the second connection points are the same.

7. The OLED display device according to claim 6, wherein two ends of the first internal wiring are two first connection points; two ends of the second internal wiring are two second connection points.

8. The OLED display device according to claim 7, wherein equivalent resistances of portions between any two adjacent first connection points on the first internal wiring are equal; and equivalent resistances of the portion between any two adjacent second connection points on the second internal wiring are equal.

9. The OLED display device according to claim 1, wherein the first internal wiring and the second internal wiring are located in the same straight line.

10. An OLED display device, comprising: a detection chip, two external input wirings electrically connected to the detection chip, a plurality of sensing lines electrically connected to the detection chip, and an OLED panel electrically connected to the plurality of sensing lines;

the detection chip comprising a first internal wiring and a second internal wiring spaced apart from each other, and a plurality of switches in one-to-one correspondence with the plurality of sensing lines;

a plurality of first connection points spaced apart from each other and a third connection point between two ends of the first internal wiring provided on the first internal wiring, a plurality of second connection points apart from each other and a fourth connection point between two ends of the second internal wiring provided on the second internal wiring;

the plurality of sensing lines in one-to-one correspondence with the plurality of first connecting points and the plurality of second connecting points respectively, one ends of the plurality of sensing lines electrically connecting to one ends of the corresponding switches, the other ends of the plurality of sensing lines electrically connecting to the OLED panel;

and the other ends of the corresponding switches respectively electrically connecting to the first connection point or the second connection point corresponding to the sensing lines connected thereto, one ends of the two external input wirings electrically connecting to the third connection point and the fourth connection point respectively, the other ends of the two external input wirings accessing to a reference voltage;

wherein the plurality of switches electrically connects one end of the sensing line to the corresponding first connection point or the second connection point when the OLED panel is displayed;

wherein equivalent resistances of portions that any two adjacent switches respectively connected to the corresponding first connection points are equal, and equivalent resistances of the portions that any two adjacent switches respectively connected to the corresponding second connection points are equal;

wherein equivalent resistances of the first internal wiring at portions located on both sides of the third connection point are equal;

wherein equivalent resistances of the second internal wiring at portions located on both sides of the fourth connection point are equal; and wherein equivalent resistances of the first internal wiring and the second internal wiring are equal.

11. The OLED display device according to claim 10, wherein quantities of the first connection points and the second connection points are the same.

12. The OLED display device according to claim 11, wherein two ends of the first internal wiring are two first connection points; two ends of the second internal wiring are two second connection points.

13. The OLED display device according to claim 12, wherein equivalent resistances of portions between any two adjacent first connection points on the first internal wiring are equal; and equivalent resistances of the portion between any two adjacent second connection points on the second internal wiring are equal.

14. The OLED display device according to claim 10, wherein the first internal wiring and the second internal wiring are located in the same straight line.

* * * * *